(12) United States Patent
Xu

(10) Patent No.: US 7,358,283 B2
(45) Date of Patent: Apr. 15, 2008

(54) RADIATION CURABLE COMPOSITIONS USEFUL IN IMAGE PROJECTION SYSTEMS

(75) Inventor: Pingyong Xu, Valencia, CA (US)

(73) Assignee: 3D Systems, Inc., Rock Hill, SC (US)

( * ) Notice: Subject to any disclaimer, the term of this patent is extended or adjusted under 35 U.S.C. 154(b) by 393 days.

(21) Appl. No.: 11/096,739

(22) Filed: Apr. 1, 2005

(65) Prior Publication Data

US 2006/0223901 A1 Oct. 5, 2006

(51) Int. Cl.
*C08F 2/46* (2006.01)
*G03C 5/00* (2006.01)
(52) U.S. Cl. .............................. 522/42; 522/91; 522/93; 522/64; 522/83; 430/269
(58) Field of Classification Search ............... 522/91, 522/93, 18, 42, 64, 83; 430/269
See application file for complete search history.

(56) References Cited

U.S. PATENT DOCUMENTS

| | | | | |
|---|---|---|---|---|
| 5,128,391 A | * | 7/1992 | Shustack | 522/92 |
| 5,977,276 A | * | 11/1999 | Toh et al. | 526/308 |
| 6,316,516 B1 | * | 11/2001 | Chien et al. | 522/91 |
| 6,593,390 B1 | * | 7/2003 | Johnson et al. | 522/74 |

* cited by examiner

*Primary Examiner*—Susan W Berman
(74) *Attorney, Agent, or Firm*—Ralph D'Alessamdro; William A. Simons

(57) ABSTRACT

A radiation curable composition comprising: A) at least one urethane poly(meth) acrylate compound; B) at least one poly(meth)acrylate compound; C) at least one polyester poly(meth)acrylate compound; D) at least one silicone poly (meth)acrylate compound; E) at least one visible light range free radial photopolymerization initiator; and F) at least one UV light range free radical polymerization initiator.

21 Claims, No Drawings

RADIATION CURABLE COMPOSITIONS USEFUL IN IMAGE PROJECTION SYSTEMS

BACKGROUND OF THE INVENTION

1. Field of the Invention

The present invention relates to radiation curable compositions useful in visible light image projection systems. More specifically, the present invention relates to (meth) acrylate-based compositions that contains two or more free radical photoinitiators in both the visible and UV light ranges.

2. Brief Description of the Art

Visible light image projection systems are a recent development in the three-dimensional solid imaging field. Such systems are an alternative to stereolithographic solid imaging systems using laser scanning. Image projection systems use visible light to initiate photocuring and are an extremely low cost approach to solid imaging when compared to stereolithographic systems that use laser beams to initiate photocuring. The image projection process may employ an endless flexible light permeable belt coated with a resin which is moved through an exposure station where a digital light projector imagewise exposes the resin through the light permeable belt to imagewise solidify and form a cured resin layer. The light source is above the belt and a build platform which supports the solidified resin layer below the endless belt. After this imagewise exposure and curing, the imaged and cured resin layer is separated from the belt and remains adhered to the build platform on top of previously exposed layers. This process is then repeated until a desired three-dimensional object is made. Resin layers are repeatedly coated onto the endless belt and then imagewise exposed. Each solid resin layer is then separated from the belt and remains adhered to the support platform with subsequent exposed layers until the completed object is formed.

The curable resins used in image projection systems need to have a combination of desirable properties. Preferably, such resins should have little or no surface tackiness and should have reduced adhesion properties so they can be easily removed from the endless belt, yet have sufficient physical properties so that they form useful three-dimensional objects. Moreover, it is desirable they produce a dry part that the end user can handle right off of the image projection machine without any danger of sensitization resulting from skin contact with the formed three-dimensional object.

There is a need today for better-performing resin compositions that will work with these image projection systems. The present invention offers a solution to that need.

BRIEF SUMMARY OF THE INVENTION

Therefore, one aspect of the present invention is directed to a radiation-curable composition useful for the production of three-dimensional solid articles by visible light image projection systems that comprises:

(A) at least one urethane poly(meth)acrylate compound;
(B) at least one poly(meth)acrylate compound;
(C) at least one polyester poly(meth)acrylate compound;
(D) at least one silicone poly(meth)acrylate compound;
(E) at least one visible light range free radical polymerization initiator; and
(F) at least one UV light range free radical polymerization initiator.

Still another aspect of the present invention is directed to three-dimensional solid articles made from the above-noted curable composition by a n image projection system.

The present composition offers several advantages. The compositions are easily released from various transfer films and has relatively quick cure to be tack free. Another aspect of the present invention is to provide cured three-dimensional parts with a desirable combination of physical properties. Another advantage is the present composition provides a resin material that permits the use of reliable image projection processes to produce high quality three-dimensional parts.

DETAILED DESCRIPTION OF THE INVENTION

The term "(meth)acrylate" as used in present specification and claims refers to both acrylates and methacrylates.

The term "poly(meth)acrylate" as used in the present specification refers to both acrylates and methacrylates that have more than one acrylate or methacrylate functionality. Examples include diacrylates, triacrylates, tetraacrylates, pentaacrylates, dimethacrylates, trimethacrylates, tetramethacrylates and pentaacrylates.

It is to be understood that "light" can mean electromagnetic radiation in the wavelength range including infrared, visible, ultraviolet and x rays, that when traveling in a vacuum moves with a speed of about 186,281 miles per second or 300,000 kilometers per second.

The novel compositions of the present invention contain a mixture of six separate components or compounds listed above as (A) to (F). The compositions may contain these six separate ingredients in any proportion that would be useful as radiation-curable compositions in visible light image projection systems. These compositions may further optionally contain colorants and other additives.

(A) Urethane Poly(meth)acrylate Compounds

The compositions of the present invention contain at least one urethane poly(meth)acrylate compound. Preferably, this compound is an urethane di(meth)acrylate compound. More preferably, this compound is an urethane diacrylate oligomer such as Sartomer PRO 6817 available from Sartomer Company of Exton, Pa.

The urethane poly(meth)acrylate compound or compounds preferably constitute from about 10% to 30% by weight of the total composition; more preferably, from about 18% to about 25% by weight of the total composition.

(B) Poly(meth)acrylate Compounds

The composition of the present invention contain at least one poly(meth)acrylate compound. This component (B) is different than the other components in this composition. Preferably, this component is a diacrylate monomer that may be polymerized by free radicals. More preferably, this component is tricyclodecane dimethanol diacrylate monomer such as Sartomer SR833S available from Sartomer Company. This compound can be used in a variety of applications wherein both flexibility and toughness are required.

The poly(meth)acrylate compound or compounds preferably constitute from about 20% to about 40% by weight of the total composition; more preferably, from about 25% to about 36% by weight of the total composition.

(C) Polyester Poly(meth)acrylate Compounds

Besides the two above-described components, the present invention also includes at least one polyester poly(meth)acrylate compound.

Preferably, the polyester poly(meth)acrylate compound or compounds constitute from about 20% to about 50% by weight of the total composition; more preferably, from about 25% to about 45% by weight of the total composition.

One preferred embodiment of the present invention includes two such compounds. One compound is a low viscosity amine-modified polyacrylate polyester oligomer such as Ebecryl 83 available from UCB Chemicals Corp. of Smyrna Ga. The second compound is a polyester acrylate such as SARTOMER PRO 6169 (also known as CN2302) available from the Sartomer Company. In this preferred embodiment, the amine-modified polyester poly(meth)acrylate compound constitutes about 5% to about 20% by weight of the total composition and the polyester polyacrylate constitutes about 15% to about 35% by weight of the total composition.

(D) Silicone Poly(meth)acrylate Compounds

The fourth component of the present composition is at least one silicone poly(meth)acrylate compound. This component provides slip or release properties to the formulation and helps ensure that the cured products will have a tack free surface. One preferred compound is Ebecryl 350 silicone polyacrylate available from UCB Chemicals Corp.

The silicone poly(meth)acrylate compound(s) is preferably present in an amount form about 0.1% to about 3% by weight of the total composition; more preferably, it is present in an amount form about 0.5% to about 2% by weight of the total composition.

(E) Visible Light Range Free Radical Polymerization Initiators

The visible light range free radical polymerization initiator(s) can be any free radical polymerization initiator that will start a free radical reaction when exposed to radiation in the spectral range including about 350 nanometers to about 500 nanometers. The preferred visible light range free radical polymerization initiator(s) is bis(2,4,6-trimethylbenzoyl)-phenylphosphine oxide which is available as IRGACURE 819 from Ciba Specialty Chemicals, Inc.

The visible light range free radical polymerization initiator(s) is preferably present in an amount from about 0.5% to about 7% by weight, based on the total weight of the composition; more preferably, from about 1% to about 5% by weight of the total composition.

(F) UV Light Range Free Radical Polymerization Initiators

The UV light range free radical polymerization initiator(s) can be any free radical polymerization initiator(s) that will start a free radical reaction when exposed to radiation in the UV light spectrum (including about 260 nanometers to about 380 nanometers). The preferred UV light range free radical polymerization initiator(s) is 1-hydroxycyclohexyl phenyl ketone which is available as IRGACURE I-184 from Ciba Specialty Chemicals, Inc.

The UV light range free radical polymerization initiator(s) is preferably present in amount from about 0.5% to about 7% by weight of the total composition; more preferably from about 1% to about 5% by weight of the total composition.

(G) Optional Additives

If necessary, the resin composition for image applications according to the present invention may contain other materials in suitable amounts, as far as the effect of the present invention is not adversely affected. Examples of such materials include coloring agents such as pigments and dyes, antifoaming agents, leveling agents, thickening agents, flame retardants and antioxidants.

One preferred class of additives is colorants, particularly pigments. These are added to add color to the resultant cured product. Two suitable pigments are Penn Color 9W7 white pigment and Penn Color 9S4 blue pigment, both available from Penn Color Corp. It is preferred to use such pigments in amounts from about 0.005% to about 1% by weight of the total composition.

Formulation Preparation

The novel compositions can be prepared in a known manner by, for example, premixing individual components and then mixing these premixes, or by mixing all of the components using customary devices, such as stirred vessels, in the absence of light, if desired, at slightly elevated temperature.

Process for Making Cured Three Dimensional Articles

These compositions of the present inventions can be made into cured three-dimensional solid articles with any suitable image projection system, including those that employ BenQ PB7230 projectors. Because these compositions contain both a visible light range free radical photoinitiator and a UV light range free radical photoinitiator, it is desirable to use a UV light source in conjunction with an image projection system. The UV light source can be used (i.e., the resin source can be exposed to that UV light source) before or after or together with the visible light source of the image projection system. The UV light source removes the tackiness of parts in a post-curing of built parts while the parts are in the image projection system, thus creating a dry part handling system for the operator. Of course, a person ordinarily skilled in the art would be aware that it is necessary, for each chosen light source, to select the appropriate photoinitiator and species of the above-noted components as well as run the image projection system at the preferred operations conditions to achieve the most desired results.

It is believed that such cured products are useful in the same manner as the cured products of various stereolithographic systems.

The present invention is further described in detail by means of the following Examples all parts and percentages are by weight and all temperatures are degrees Celsius unless explicitly stated otherwise.

EXAMPLES

The trade names of the components as indicated in the Examples below correspond to the chemical substances recited in the following Table 1.

TABLE 1

List of material identities and chemical compositions.

| TRADE NAMES | CHEMICAL DESIGNATION |
| --- | --- |
| SARTOMER PRO 6817 | Aliphatic urethane diacrylate oligomer |
| SARTOMER SR 833S | Tricyclodecane dimethanol diacrylate monomer |
| UCB EBECRYL 83 | Highly branched amine-modified multi-functional acrylated polyester oligomer |
| SARTOMER PRO 6169 | Highly branched polyester acrylate oligomer |
| UCB EBECRYL 350 | Silicone polyacrylate |

TABLE 1-continued

List of material identities and chemical compositions.

| TRADE NAMES | CHEMICAL DESIGNATION |
|---|---|
| CIBA IRGACURE I-184 | 1-Hydroxycyclohexyl phenyl ketone |
| CIBA IRGACURE I-819 | Bis (2,4,6-trimethyl benzoyl) — phenylphosphine oxide |
| PENN COLOR 9W7 | White pigment paste |
| PENN COLOR 9S4 | Blue pigment paste |

The formulations indicated in the Examples below were prepared by mixing the components with a stirrer at 60° C. in a glass container until a homogeneous composition was obtained. The physical data relating to these formulations was obtained as follows:

Certain measured post-cure mechanical properties of the formulations were determined on three-dimensional specimens of Example 2 produced with the aid of a BenQ PB7230 projector visible light image projection system.

The Tensile Modulus (ksi), Tensile Strength (psi), Elongation at Break (%), were all determined according to the ISO 527 method.

Example 1

The following components were mixed to produce a homogeneous liquid composition:

TABLE 2

List of components, parts by weight and percentage by weight.

| COMPONENT | PARTS (by wt.) | PERCENTAGE (by wt.) |
|---|---|---|
| SARTOMER PRO 6817 | 4.8 | 22.79 |
| SARTOMER SR 833S | 7.1 | 33.71 |
| UCB EBECRYL 83 | 2.4 | 11.40 |
| SARTOMER PRO 6169 | 5.2 | 24.69 |
| UCB EBECRYL 350 | 0.21 | 1.00 |
| CIBA IRGACURE I-184 | 0.75 | 3.56 |
| CIBA IRACURE I-819 | 0.6 | 2.85 |
| Total | 21.06 | 100 |

Example 2

The following components were mixed to produce a homogeneous liquid composition:

TABLE 3

List of all components, parts by weight and percentage by weight.

| COMPONENT | PARTS (by wt.) | PERCENTAGE (by wt.) |
|---|---|---|
| SARTOMER PRO 6817 | 4.8 | 22.71 |
| SARTOMER SR 833S | 7.1 | 33.60 |
| UCB EBECRYL 83 | 2.4 | 11.36 |
| SARTOMER PRO 6169 | 5.2 | 24.61 |
| UCB EBECRYL 350 | 0.21 | 0.99 |
| CIBA IRGACURE I-184 | 0.75 | 3.55 |
| CIBA IRGACURE I-819 | 0.6 | 2.84 |
| PENN COLOR 9W7 | 0.07 | 0.33 |
| PENN COLOR 9S4 | 0.003 | 0.01 |
| Total | 21.133 | 100.00 |

The measured mechanical properties of the Example 2 formulation are shown in Table 4.

Mechanical Properties After Visible Light Curing

TABLE 4

Mechanical properties.

| Property | 1 |
|---|---|
| Tensile Modules (ksi) | 223 |
| Tensile Strength (psi) | 4274 |
| Elongation at Break (%) | 3.7 |

While the invention has been described above with reference to specific embodiments thereof, it is apparent that many changes, modifications, and variations can be made without departing form the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A radiation curable composition useful for the production of three dimensional solid articles by visible light image projections systems comprising:
A) at least one urethane poly(meth) acrylate compound;
B) at least one poly(meth)acrylate compound;
C) at least one polyester poly(meth)acrylate compound wherein the polyester poly(meth)acrylate compound(s) is a mixture of at least one amine-modified polyester poly(meth)acrylate compound and at least one polyester polyacrylate compound;
D) at least one silicone poly(meth)acrylate compound;
E) at least one visible light range free radical photopolymerization initiator; and
F) at least one UV light range free radical polymerization initiator.

2. The composition of claim 1 wherein the urethane poly(meth)acrylate compound(s) is urethane di(meth)acrylate compound.

3. The composition of claim 1 wherein the urethane poly(meth)acrylate compound(s) is urethane diacrylate oligomer.

4. The composition of claim 1 wherein the urethane poly(meth)acrylate compound(s) is present in an amount from about 10% to about 30% by weight, based on the total amount of the composition.

5. The composition of claim 1 wherein the poly(meth)acrylate compound(s) is diacrylate monomer.

6. The composition of claim 1 wherein the poly(meth)acrylate compound(s) is tricyclodecane dimethanol diacrylate monomer.

7. The composition of claim 1 wherein the poly(meth)acrylate by weight is compound(s) present in an amount from about 20% to about 40% by weight, based on the weight of the total composition.

8. The composition of claim 1 wherein the polyester poly(meth)acrylate compound(s) is one or more polyester polyacrylates.

9. The composition of claim 1 wherein polyester poly(meth)acrylate compound(s) is present in amount from about 20% to about 50%, based on the weight of total composition.

10. The composition of claim 1 wherein the amine-modified polyester polyacrylate compound(s) is present in an amount from about 5% to about 20% by weight, based on the weight of total composition and the polyester polyacrylate compound(s) is present in an amount from about 15% to about 35% by weight, based on the total weight of the composition.

11. The composition of claim 1 wherein the silicone poly(meth)acrylate compound(s) is a silicone polyacrylate.

12. The composition of claim 1 wherein the silicone poly(meth)acrylate compound(s) is present in an amount from about 0.1% to about 3%, by weight, based on the weight of total composition.

13. The composition of claim 1 wherein the visible light range free radical polymerization initiator(s) is bis(2,4,6-trimethylbenzoyl)-phenylphosphine oxide.

14. The composition of claim 1 wherein the visible light range free radical polymerization initiator(s) is present in an amount from about 0.5% to about 7% by weight, based on the weight of the total composition.

15. The composition of claim 1 wherein the UV light range polymerization initiator(s) is 1-hydroxycyclohexyl phenyl ketone.

16. The composition of claim 1 wherein the UV light range polymerization indicator(s) is present in an amount from about 0.5% to about 7% by weight, based on the weight of total composition.

17. The composition of claim 1 wherein the composition additionally contains at least one colorant.

18. The composition of claim 17 wherein the colorant(s) is at least one pigment.

19. A radiation curable composition useful for to production of three-dimensional solid articles by visible light projection systems, said composition comprising:
   (A) about 10% to about 30% by weight of at least one urethane poly(meth)acrylate compound;
   (B) about 20% to about 40% by weight of at least one diacrylate monomer;
   (C1) about 5% to about 20% by weight of at least one amine-modified polyester polyacrylate compound;
   (C2) about 15% to about 35% by weight of at least one polyester polyacrylate compound;
   (D) about 0.1% to about 3% by weight of at least one silicone polyacrylate compound;
   (E) about 0.5% to about 7% by weight of at least one visible light range free radical polymerization initiator; and
   (F) about 0.5% to about 7% by weight of at least one UV light range free radical polymerization initiator; wherein all of the weight percentages are based on total weight of the composition.

20. The composition of claim 19 wherein the composition additionally contains about 0.005% to about 1% by weight of at least one pigment; said weight percentage based on total weight of the composition.

21. A radiation curable composition useful for the production of three-dimensional solid articles by visible light projection systems, said compositions comprising:
   (A) about 10% to about 30% by weight of at least one urethane poly(meth) acrylate compound;
   (B) about 20% to about 40% by weight of at least one diacrylate monomer;
   (C) about 20% to about 50% of at least one polyester poly(meth) acrylate compound(s); wherein said polyester poly(meth) acrylate compound(s) is a mixture of at least one amine-modified polyester poly(meth) acrylate compound and at least one polyester polyacrylate compound;
   (D) about 01% to about 3% by weight of at least one silicone polyacrylate;
   (E) about 0.5% to about 7% by weight of at least one visible light range free radical polymerization initiator; and
   (F) about 0.5% to about 7% by weight of at least one UV light range free radical polymerization initiator; wherein all of the weight percentages are based on total weight of the composition.

* * * * *